United States Patent
Hauptman (10) Patent No.: US 7,489,125 B2
(45) Date of Patent: Feb. 10, 2009

(54) CALIBRATING A TESTER USING ESD PROTECTION CIRCUITRY

(75) Inventor: Steven L. Hauptman, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 101 days.

(21) Appl. No.: 11/695,234

(22) Filed: Apr. 2, 2007

(65) Prior Publication Data

US 2008/0243740 A1    Oct. 2, 2008

(51) Int. Cl.
*G01R 31/26* (2006.01)

(52) U.S. Cl. .................. 324/158.1; 324/763; 324/765

(58) Field of Classification Search .............. None
See application file for complete search history.

(56) References Cited

U.S. PATENT DOCUMENTS 6,331,783 B1 * 12/2001 Hauptman ............ 324/765
7,333,311 B2 * 2/2008 Kerley et al. ............ 361/56

* cited by examiner

*Primary Examiner*—Minh N Tang
(74) *Attorney, Agent, or Firm*—Fish & Richardson P.C.

(57) ABSTRACT

An apparatus includes a circuit element that requires calibration, a calibration circuit for use in calibrating the circuit element, and a damping diode electrically connectable in a first path that includes the calibration circuit and electrically connectable in a second path that excludes the calibration circuit. The first path is for electrically connecting the calibration circuit and the circuit element, and the second path is for use in protecting the apparatus from electrostatic discharge. A switching circuit is used to switch the clamping diode between the first path and the second path.

20 Claims, 5 Drawing Sheets

CALIBRATING A TESTER USING ESD PROTECTION CIRCUITRY

TECHNICAL FIELD

This patent application relates generally to calibrating automatic test equipment (ATE) via circuitry used to protect against electrostatic discharges (ESD).

BACKGROUND

Automatic test equipment (ATE) refers to an automated, usually computer-driven, approach to testing devices, such as semiconductors, electronic circuits, and printed circuit board assemblies. A parametric measurement unit (PMU) is typically part of an ATE. A PMU is used during device testing to measure parameters, such as voltage and current, at a device pin, and to regulate those parameters. The PMU attempts to ensure that, during testing, proper parameter values are applied to the device under test (DUT). Signals to and from the PMU are typically DC (direct current).

A PMU typically includes circuitry for forcing a voltage and/or current to the DUT. Impedance (e.g., resistance) in a circuit path leading from this circuitry to the DUT affects the amount of current provided to the DUT. This resistance can be calibrated in order to control the current to the DUT. Heretofore, switches were used to switch between an AC (alternating current) calibration and calibration (i.e., DC calibration) associated with the PMU. One problem with this approach is that the switches introduce discontinuities and parasitics that corrupt high-speed AC waveforms.

SUMMARY

This patent application describes calibrating ATE via circuitry, such as clamping diodes, used to substantially protect against ESD.

This patent application describes an apparatus which includes a circuit element that requires calibration, a calibration, circuit for use in calibrating the circuit element, and a clamping diode electrically connectable in a first path that includes the calibration circuit and electrically connectable in a second path that excludes the calibration circuit. The first path is for electrically connecting the calibration circuit and the circuit element, and the second path is for use in protecting the apparatus from electrostatic discharge. A switching circuit is used to switch the clamping diode between the first path and the second path. The foregoing apparatus may also include one or more of the following features, either alone or in combination.

The calibration circuit may comprise a voltage source, a first resistive circuit electrically connected to the voltage source, and a first voltage lead at an input of the first resistive circuit and a second voltage lead at an output of the first resistive circuit.

The apparatus may comprise an analog-to-digital (A/D) converter electrically connected to the first voltage lead and the second voltage lead, which is used to digitize a voltage drop across the first resistive circuit that is obtained through the first and second voltage leads when the clamping diode is switched into the first path. A processing device may be configured or programmed to receive, via the A/D converter, digital data that corresponds to the voltage drop. The processing device may be configured or programmed to determine an amount of current associated with the voltage drop, and to adjust a property of the circuit element based on the amount of current.

The circuit element may comprise a second resistive circuit having a resistance that is adjustable. The processing device may be configured or programmed to obtain a voltage across the second resistive circuit, and to adjust the resistance of the second resistive circuit based on the amount of current associated with the voltage drop. The second, resistive circuit may comprise a variable resistor.

The first resistive circuit may comprise plural resistors that are switchable into, or out of, the first resistive circuit in order to vary the resistance of the resistive circuit and/or in order to adjust an amount of current passing through the first resistive circuit.

The apparatus may comprise a parametric measurement unit (PMU). The circuit element may be electrically connected to the PMU, and the circuit element may be used for calibrating current flow to the PMU.

The clamping diode may be switched into the second path. The clamping diode may prevent the PMU from receiving greater than a predetermined amount of current.

This patent application also describes a method that comprises switching to a first path for calibrating a circuit element from a second path for protecting against electrostatic discharge, where the first path and the second path have one or more components in common, and where the first path is for electrically connecting a calibration circuit to the circuit element. The method also includes determining a current through the calibration circuit based on a resistance of the calibration circuit and calibrating the circuit element based on to a current through the circuit element. The current through the circuit element substantially corresponds to the current through the calibration circuit. The foregoing method may also include one or more of the following features, either alone or in combination.

The current through the circuit element may be substantially equal to the current through the calibration circuit. The circuit element may comprise a variable resistor, and calibrating the circuit element may comprise adjusting a resistance of the variable resistor. The method may comprise measuring a voltage across the variable resistor and adjusting the resistance based on the voltage across the variable resistor and the current through the calibration circuit. The second path may protect a parametric measurement unit (PMU) from currents that exceed a predefined value. The method may farther comprise switching from the first path to the second path in order to protect the PMU from the currents that exceed a predefined value. Protecting the PMU may comprise clamping the voltages outside of a predetermined range.

This patent application also describes circuitry to protect ATE from electrostatic discharge and to calibrate a circuit element of the ATE. The circuitry comprises a calibration circuit for use in calibrating the circuit element, where the calibration circuit comprises a resistive circuit that passes current, and one or more diodes that are configurable (i) to prevent voltages outside of a predetermined range from affecting operation of the ATE, or (ii) to allow the current from the calibration circuit to pass to the circuit element. The circuitry also comprises one or more switches to configure the diodes, and a processing device to obtain a value of the current passing through the resistive circuit and to adjust a property of the circuit element based on die value of the current passing through the resistive circuit. The foregoing circuitry may also include one or more of the following features, either alone or in combination.

The one or more diodes may comprise a first diode for substantially preventing voltages below a first predetermined value from affecting operation of the ATE, and a second diode for substantially preventing voltages above a second predetermined value from affecting operation of the ATE.

The one or more switches may comprise a first switch to configure the first diode to substantially prevent voltages below a first predetermined value from affecting operation of the ATE, and a second switch to configure the first diode to allow at least some of the current from the calibration circuit to pass to the circuit element.

Use circuit element may comprise a second resistive circuit for use in adjusting an amount of current to a PMU of the ATE. The resistive circuit may comprise a variable resistor alone or in combination with one or more impedance elements, and the property of the circuit element may comprise a resistance of the variable resistor.

The details of one or more examples are set forth in the accompanying drawings and the description below. Further features, aspects, and advantages will become apparent from the description, the drawings, and the claims.

DESCRIPTION OF THE DRAWINGS

Like reference numerals in different FIGS. indicate like elements.

DETAILED DESCRIPTION

Figure 1:
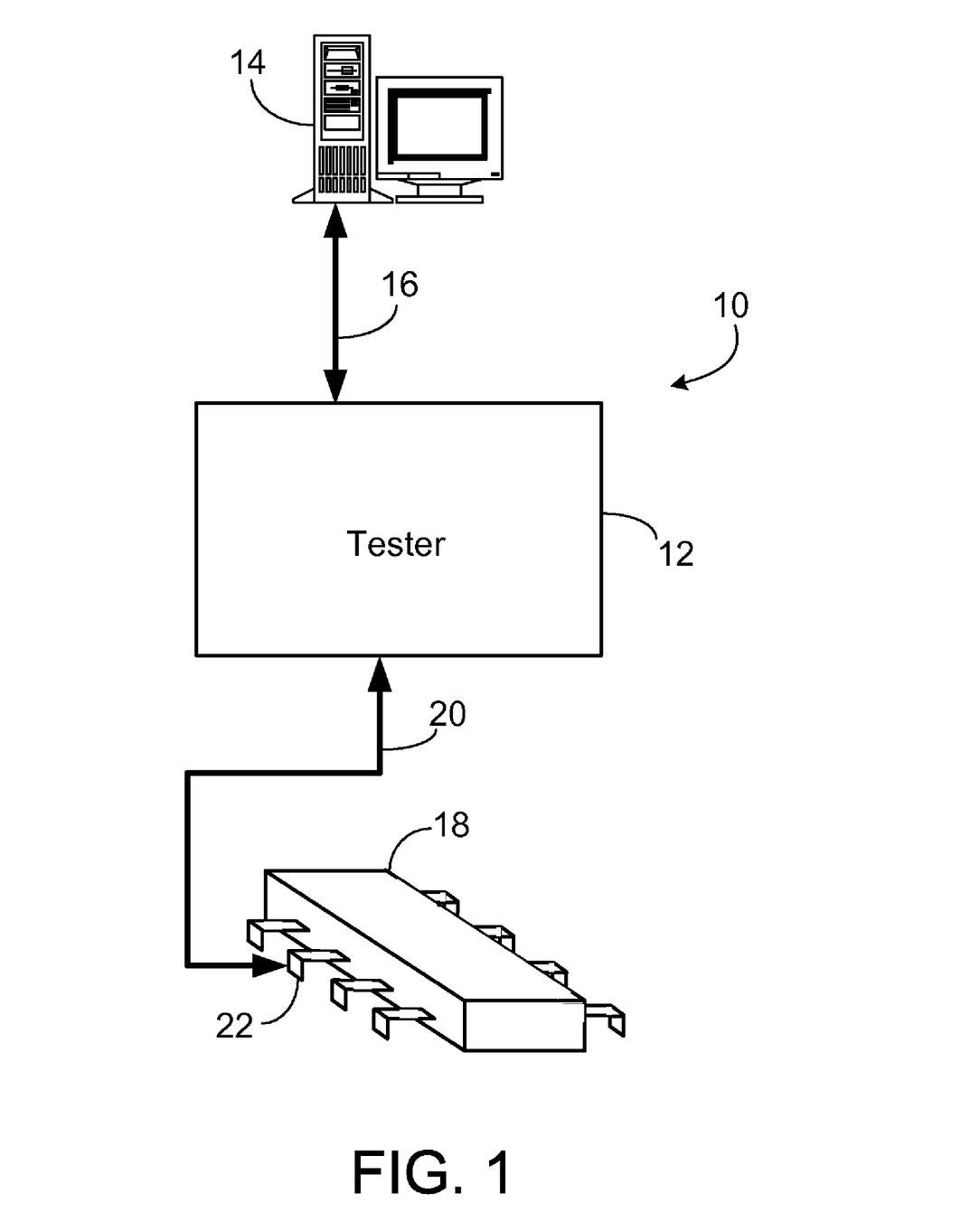
FIG. 1 is a block diagram of ATE for testing devices.

Referring to FIG. 1, an ATE system 10 for testing a device-under-test (DUT) 18, such as a semiconductor device, includes a tester 12. To control tester 12, system 10 includes a computer system 14 that interfaces with tester 12 over a hardwire connection 16. Typically, computer system 14 sends commands to tester 12 to initiate execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU DC test signals, PE AC test signals, etc) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12, For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
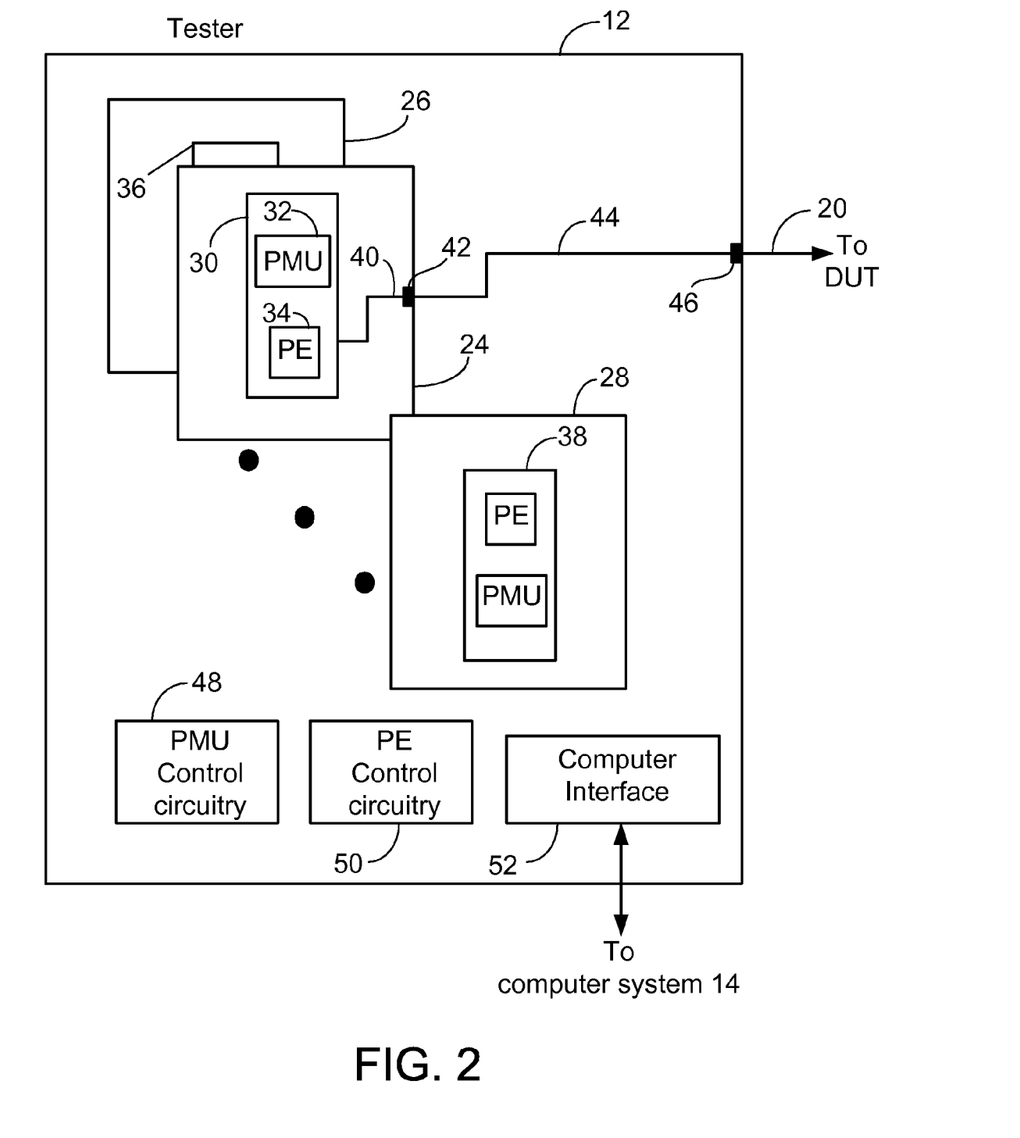
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large cumber of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC) for performing particular test functions. For example, interface card 24 includes IC chip 30 for performing parametric measurement unit (PMU) tests and pin electronics (PE) tests. IC chip 3D has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically, PMU testing involves providing a DC voltage or current signal-to the DUT to determine such quantities as input and output impedance, current leakage, and other types of DC performance characterizations. PE testing involves sending AC test signals, or waveforms, to a DUT (e.g., DUT 18) and collecting responses to further characterise the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals from interface card 24 to DUT 18, a conducting trace 40 connects IC chip 30 to an interface hoard connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bi-directional signal passage between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interlace board 24 for delivering and collecting signals. However, IC chip 30 (along with IC chips 36 and 38) typically has multiple pins (e.g. eight, sixteen, etc.) that are respectively connected with multiple conducting traces and corresponding conductors for providing and collecting signals from the DUT (via a DIB). Additionally, in some arrangements, tester 12 may connect to two or more DUTs for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analysing DUT responses. The PMU control circuitry and PE control circuitry may be implemented using one or more processing devices. Examples of processing devices include, but are not limited to, a microprocessor, a microcontroller, programmable logic (e.g., a field-programmable gate array), and/or combination(s) thereof. Tester 12 also includes a computer interlace 52 that allows computer system 14 to control the operations executed by tester 12 and also allows data (e.g., test parameters, DUT responses, etc.) to pass between tester 12 and computer system 14.

The following describes calibrating impedance (e.g., resistance) in a circuit path leading from a PMU to the DUT in order to affect the amount of current provided to the DUT. The calibration process and circuitry are described in the context of a single PMU stage 32 (PMU 32); however, they may be used for each of multiple PMUs.

Figure 3:
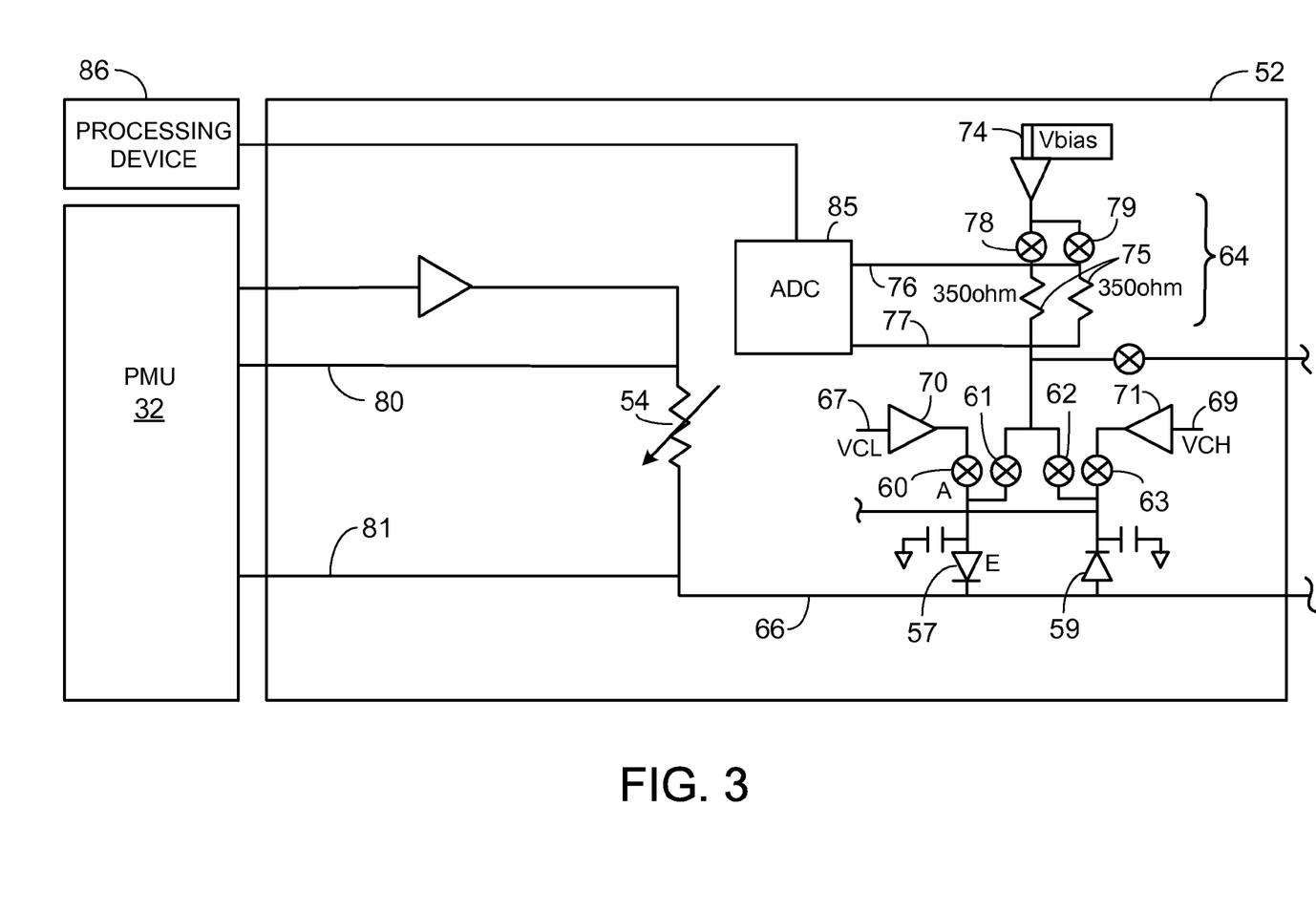
FIGS. 3 to 5 are diagrams showing the same circuitry for calibrating die ATE and for protecting the ATE against electrostatic discharge.

FIG. 3 shows circuitry 52, which includes a calibration circuit for calibrating the resistance of resistive circuit 54 between PMU 32 and a DUT. Circuitry 52 also includes ESD protection circuitry to prevent excessive current, e.g., from power surges or the like, from reaching PMU 32 and damaging PMU 32. The BSD protection circuitry also protects pin electronics and other circuitry in the ATE, including, e.g., ASICs (application-specific integrated circuit) and the like.

Figure 4:
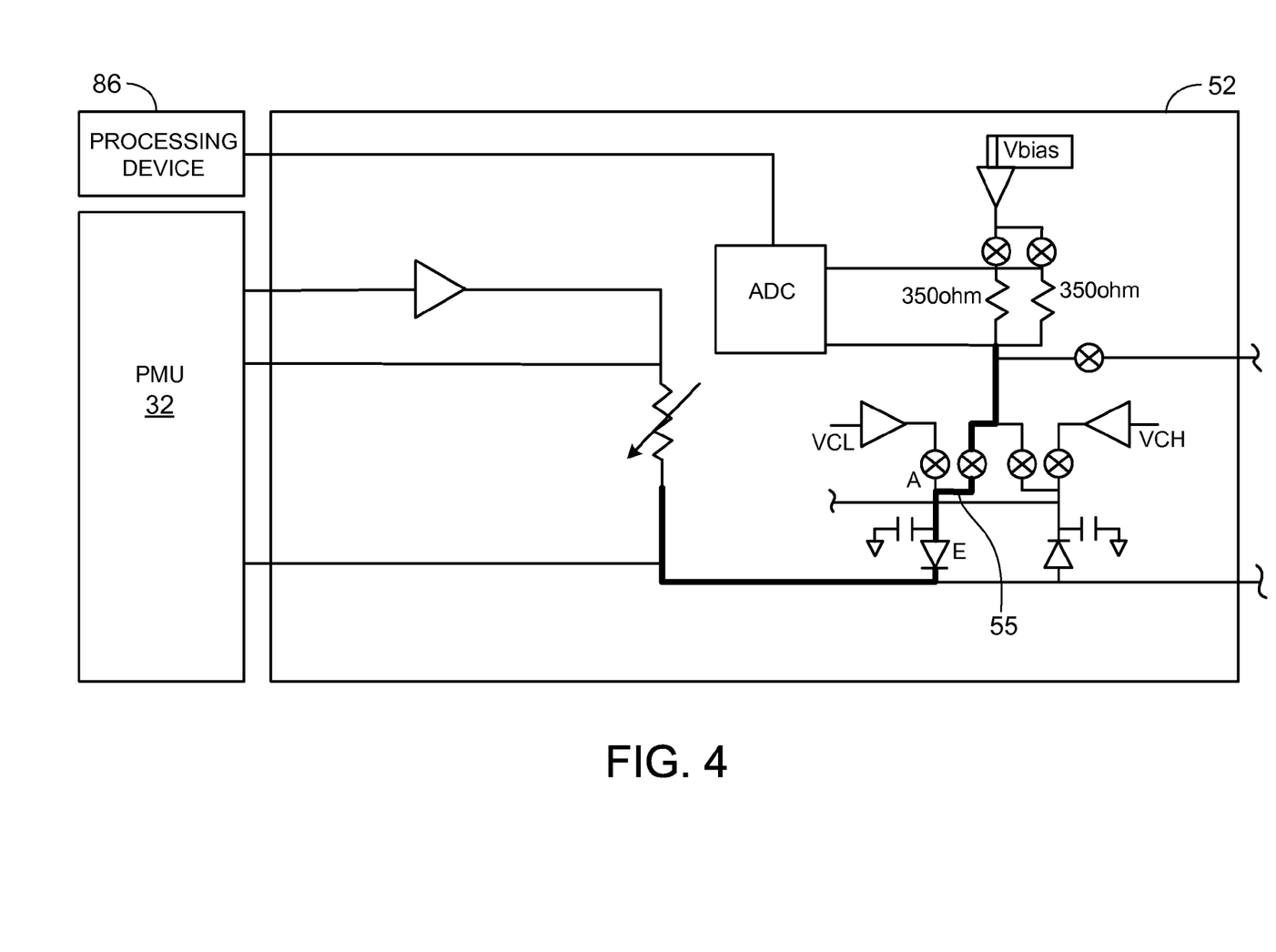
Figure 5:
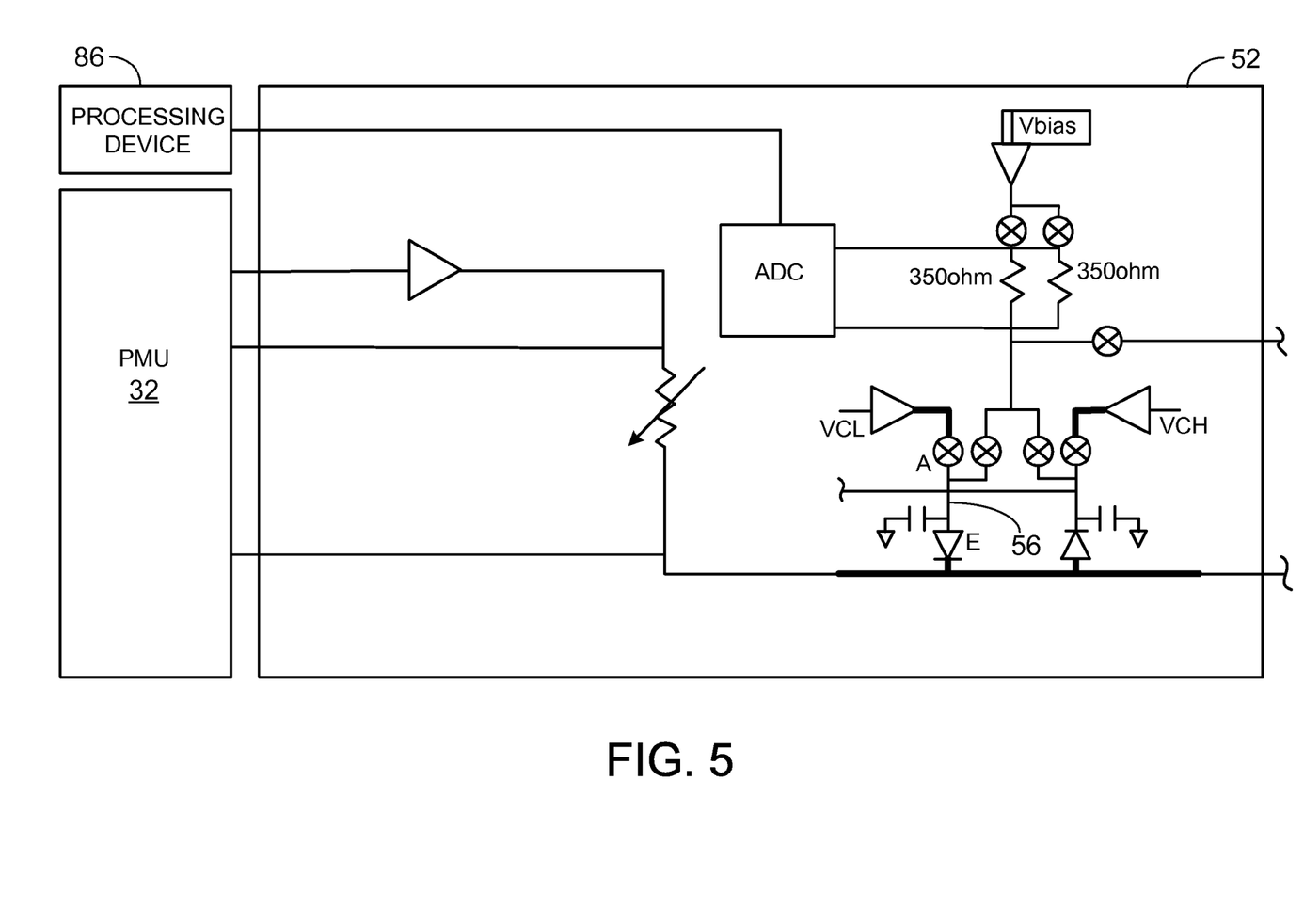

Circuitry 52 includes two paths: a calibration path 55 (along the bold path in FIG. 4) and an ESD protection path 56 (along the bold path in FIG. 5). It is noted that many of today's ATE already include the ESD protection circuitry. By taking advantage of this existing ESD protection circuitry, it is possible to calibrate the PMU independently of AC calibration. That, is, use of the ESD protection circuitry for calibration eliminates the need to switch between AC and DC calibration paths and, thus, the need for switches and the like that can corrupt high-speed AC signals.

Referring to FIGS. 3 to 5, diodes 57 and 59 are in both the calibration path and the ESD protection path. In this implementation, diodes 57 and 59 are clamping diodes that, depending on the configuration of switches 60 to 63, may be used to divert current resulting from ESD surges from PMU 32 or to provide current to (or draw current from) PMU 32 in order to calibrate resistive circuit 54. In this implementation, switches 60 to 63 may be electronic switches, which may be implemented using, e.g., transistors or other circuitry, or micro-mechanical switches that may be controlled electrically. Any type of switch may be used. Furthermore, although four switches are shown in FIGS. 3 to 5, any number of switches may be used to perform the switching function.

To protect PMU 32 against ESD, switches 61 and 62 are opened and switches 60 and 63 are closed. Opening switches 61 and 62 disconnects calibration circuit 64 (described below) from the circuit path containing PMU 32 and resistive circuit 54, Closing switches 60 and 63 connects circuitry 52 in an ESD protection configuration. In the ESD protection configuration, diodes 5 and 59 are electrically connected, and biased, so that they clamp the voltage on circuit path 66 to a predetermined range. To this end, voltage sources $V_{CL}$ 67 and $V_{CH}$ 69 bias diodes 57 and 59, respectively, so that the diodes clamp the appropriate voltage range. For example, $V_{CL}$ may be a low voltage to clamp, e.g., a low or negative, voltage on circuit path 66, $V_{CH}$ may be a high voltage to clamp, e.g., a high, voltage on circuit path 66. $V_{CL}$ and $V_{CH}$ may be changed to vary the amount and type of ESD protection on circuit path 66. Amplifiers 70 and 71 pass the $V_{CL}$ and $V_{CH}$ values to bias the diodes.

During operation, excess current resulting from an ESD surge on circuit path 66 is drawn from circuit path 66 through either of diodes 57 or 59. For example, if the voltage from an ESD surge on circuit path 66 is positive and m excess of the diode clamping voltage, the resulting current may be drawn through diode 57 and into amplifier 70. For example. If the clamping voltage is 20V and the voltage from the ESD surge is 25 V, clamping diode will draw current resulting from the excess 5V. If die voltage from an ESD surge on circuit path 66 is negative and in excess of the diode clamping voltage, the resulting current may be drawn through diode 59 and amplifier 11. For example, if the clamping voltage is −20V and the voltage from the BSD surge is −2.5V, clamping diode will draw current resulting from the excess −5 V. Thus, by biasing diodes 57 and 59 appropriately, PMU 32 can be protected against current from these ESD surges.

To calibrate resistive circuit 54, switches 60, 62 and 63 are opened and switch 61 is closed. In this implementation, resistive circuit 54 includes one or more resistive elements. For example, resistive circuit 54 may be a variable resistor, which has a resistance that is voltage-dependent. That is, the resistance of resistive circuit 54 may be dependent on the voltage applied to resistive circuit 54. Resistive circuit 54 may also include one or more resistors having fixed values (not shown), which can be switched into, or out of, the resistive circuit in order to vary its overall resistance. Resistive circuit 54 may include a combination of variable resistors and fixed resistors. Resistive circuit 54 may also include other elements, such as capacitors, inductors, and transistors.

Closing switch 61 electrically connects calibration circuit 64 to circuit path 66 containing PMU 32 and resistive circuit 54. In this implementation, calibration circuit 64 includes a voltage source 74 ($V_{bias}$), a resistive circuit 75 electrically connected to voltage source 74, and voltage leads 76 and 77 at an input of resistive circuit 75 and at an output of resistive circuit 75, respectively. In this implementation, resistive circuit 75 includes multiple resistors. These multiple resistors may have the same or different resistances, and may be switched into, or out of, resistive circuit 75 in order to adjust (e.g., increase or decrease) the total effective resistance of resistive circuit 75. The resistors may have fixed resistances or resistances that are variable. In the example shown in FIGS. 3 to 5, there are two resistors having resistances of 35Ω and 350Ω. Resistive circuit 75 may also include other elements, such as capacitors, inductors, and transistors (not shown).

Calibration circuit 64 includes switches 78 and 79 for switching resistance into, or out of, resistive circuit 75. In this implementation, switches 78 and 79 may be electronic switches, which may be implemented using, e.g., transistors or other circuitry, or micro-mechanical switches that may be controlled electrically. Any type of switch may be used. Furthermore, although only two switches are shown in FIGS. 3 to 5, any number of switches may be used to perform the switching function. For example, there may be one switch per resistor as shown in FIGS. 3 to 5 or multiple switches per resistor or a single switch for multiple resistors.

Calibration circuit 64 also includes a voltage source 74, which applies voltage to resistive circuit 75, thereby causing current to flow through resistive circuit 75. Changing the resistance of resistive circuit 75, as explained above, changes the amount of current that can (low through resistive circuit 75. With switch 61 closed, the current through resistive circuit 75 also flows out of calibration circuit 64 over circuit path 66 and through resistive circuit 54. Using this current, which has a known value, it is possible to calibrate resistive circuit 54, as described below.

To this end, an analog-to-digital converter (ADC) 85 is electrically connected to voltage leads 76 and 77. ADC 85 digitizes a voltage drop across resistive circuit 75 that is measured via the voltage leads. A processing device (e.g., 86) receives digital data that corresponds to the voltage drop from the ADC, and determines an amount of current associated with the voltage drop. Specifically, the processing device knows the resistance of resistive circuit 75 and the voltage drop and, using Ohm's law, calculates the current value. In this regard, the processing device may be used to control the operation of switches 78 and 79 to program the resistance of resistive circuit 76 and also to control the operation of switches 60 to 63. The processing device may be, e.g., a microprocessor, microcontroller, programmable logic, or the like.

As shown in FIGS. 3 to 5, voltage leads 80 and 81 are connected across resistive circuit 54. In this implementation, voltage leads 80 and 81 are connected to PMU 32. The PMU (or other circuitry) may digitize the voltage difference between these voltage leads and provide the resulting digitized value to the processing device. The processing device thereby obtains the voltage drop across resistive circuit 54. The processing device calibrates (i.e., adjusts) the resistance of the resistive circuit 54 based on this voltage drop and the current passing through resistive circuit 54. More specifically, the current through resistive circuit 54 is equal to, or at least substantially equal to, the current passing through resistive circuit 75. In calibration circuit 64. Processing device 86 (e.g., PMU control circuitry 48) sets the voltage across resistive circuit 54 in order to achieve a predefined resistance, and confirms the predefined resistance based on the known amount of current flowing through the resistive circuit. If any adjustments need to be made, the processing device may vary the voltage across resistive circuit 54 in order to vary its resistance. The predefined resistance of resistive circuit 54 may be the same as, or different from (e.g., a multiple or fraction of) the resistance set in resistive circuit 75 of calibration circuit 64. When, calibrating the resistance of resistive circuit 54, the processing device may take into account parasitic resistance in the circuit path containing resistive circuit 54. The parasitic resistance may be measured via other voltage leads (not shown) or may be pre-programmed into the processing device.

The calibration process described above (hereinafter "the calibration process") has numerous advantages. For example, it enables DC current calibration without use of an external interface board or other equipment it also reduces the need for switches, such as relays or optofets, to perform DC calibration, as explained above. The calibration process also permits calibration without unlocking the ATE from handlers or probes.

The calibration process described above is not limited to use with the hardware and software described above. The calibration process can be implemented using any hardware and/or software. For example, the calibration process, or portion(s) thereof, can be implemented, at least in part, using digital electronic circuitry, or in computer hardware, firmware, software, or in combinations thereof.

The calibration process (e.g., the functions performed by the processing device) can be implemented, at least in part, via a computer program product, i.e., a computer program tangibly embodied in an information carrier, e.g., in a one or more machine-readable media or in a propagated signal, for execution by, or to control the operation of data processing apparatus, e.g., a programmable processor, a computer, or multiple computers. A computer program can be written in any form of programming language, including complied or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing the calibration process can be performed by one or more programmable processors executing one or more computer programs to perform the functions of the calibration process. All or part of the ATE can be implemented as, special purpose logic circuitry, e.g., an FPGA (field programmable gate array) and/or an ASIC.

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Referring to FIG. 3, in an alternative calibration configuration, switches 60, 61 and 63 may be opened and switch 62 may be closed. In this configuration, current flows from circuit path 66 into calibration circuit 64, The current is measured across resistive circuit 75, as above. Thereafter, calibration proceeds as described above.

Elements of different embodiments described herein may be combined to form other embodiments not specifically set forth above. Other embodiments not specifically described herein are also within the scope of the following claims.

What is claimed is:

1. An apparatus comprising:
   a circuit element that requires calibration;
   a calibration circuit for use in calibrating the circuit element;
   a clamping diode electrically connectable in a first path that includes the calibration circuit and electrically connectable in a second path that excludes the calibration circuit, the first path for electrically connecting the calibration circuit and the circuit element, and the second path for use in protecting the apparatus from electrostatic discharge; and
   a switching circuit to switch the clamping diode between the first path and the second path.

2. The apparatus of claim 1, wherein the calibration circuit comprises:
   a voltage source;
   a first resistive circuit electrically connected to the voltage source; and
   a first voltage lead at an input of the first resistive circuit and a second voltage lead at an output of the first resistive circuit.

3. The apparatus of claim 2, further comprising:
an analog-to-digital (A/D) converter electrically connected to first voltage lead and the second voltage lead, the A/D converter to digitize a voltage drop across the first resistive circuit that is obtained through the first and second voltage leads when the clamping diode is switched into the first path; and
a processing device to receive, via fee A/D converter, digital data that corresponds to the voltage drop, the processing device being configured to determine an amount of current associated with the voltage drop, and to adjust a property of the circuit element based on the amount of current.

4. The apparatus of claim 3, wherein the circuit element comprises a second resistive circuit having a resistance that is adjustable; and
wherein the processing device is configured to obtain a voltage across the second resistive circuit, and to adjust the resistance of the second resistive circuit based on the amount of current associated with the voltage drop.

5. The apparatus of claim 4, wherein the second resistive circuit comprises a variable resistor.

6. The apparatus of claim 4, wherein the first resistive circuit comprises plural resistors that are switchable into, or out of, the first resistive circuit in order to vary the resistance of the first resistive circuit.

7. The apparatus of claim 4, wherein the first resistive circuit comprises plural resistors that are switchable into, or out of, the first resistive circuit in order to adjust an amount of current passing through the first resistive circuit.

8. The apparatus of claim 1, further comprising:
a parametric measurement unit (PMU), wherein the circuit element is electrically connected to the PMU, and wherein the circuit element is used for calibrating current flow to the PMU.

9. The apparatus of claim 8, wherein when the clamping diode is switched into the second path, the damping diode preventing the PMU from receiving greater than a predetermined amount of current.

10. A method comprising:
switching to a first path for calibrating a circuit element from a second path for protecting against electrostatic discharge, the first path and the second path having one or more components in common, the first path electrically connecting a calibration circuit to the circuit element;
determining a current through the calibration circuit based on a resistance of the calibration circuit; and
calibrating the circuit element based on a current through the circuit element, the current through the circuit element corresponding to the current through the calibration circuit.

11. The method of claim 10, wherein the current through, the circuit element is substantially equal to the current through the calibration circuit.

12. The method of claim 10, wherein the circuit element comprises a variable resistor, and calibrating the circuit element comprises adjusting a resistance of the variable resistor.

13. The method of claim 12, further comprising:
measuring a voltage across the variable resistor and adjusting the resistance based on the voltage across the variable resistor and the current through the calibration circuit.

14. The method of claim 10, wherein the second path protects a parametric measurement unit (PMU) from currents that exceed a predefined value; and
wherein the method further comprises switching from the first path to the second path in order to protect the PMU from the currents that exceed a predefined value.

15. The method, of claim 10, wherein protecting the PMU comprises clamping the voltages outside of a predetermined range.

16. Circuitry to protect automatic test equipment (ATE) from electrostatic discharge and to calibrate a circuit element of the ATE, the circuitry comprising:
a calibration circuit for use in calibrating the circuit element, the calibration circuit comprising a resistive circuit that passes current;
one or more diodes that are configurable (i) to prevent voltages outside of a predetermined range from affecting operation of the ATE, or (ii) to allow the current from the calibration circuit to pass to the circuit element;
one or more switches to configure the diodes; and
a processing device to obtain a value of the current passing through the resistive circuit and to adjust a property of the circuit element based on the value of the current passing through the resistive circuit.

17. The circuitry of claim 16, wherein the one or more diodes comprises a first diode for preventing voltages below a first predetermined value from affecting operation of the ATE, and a second diode for preventing voltages above a second predetermined value from affecting operation of the ATE.

18. The circuitry of claim 17, wherein the one or more switches comprise:
a first switch to configure the first diode to prevent voltages below a first predetermined value from affecting operation of the ATE; and
a second switch to configure the first diode to allow die current from the calibration circuit, to pass to the circuit element.

19. The circuitry of claim 17, wherein the circuit element comprises a second resistive circuit for use in adjusting an amount of current to a parametric measurement unit (PMU) of the ATE.

20. The circuitry of claim 17, wherein the resistive circuit comprises, a variable resistor, and the property of the circuit element comprises a resistance of the variable resistor.

* * * * *